(12) United States Patent
Chmelar et al.

(10) Patent No.: US 11,522,477 B2
(45) Date of Patent: Dec. 6, 2022

(54) CONTACTLESS POWER SUPPLY AND MOTOR CONTROL SYSTEM

(71) Applicant: HONEYWELL INTERNATIONAL INC., Charlotte, NC (US)

(72) Inventors: Jakub Chmelar, Bily Ujezd (CZ); Jan Scheirich, Klobouky u Brna (CZ); Martin Vagner, Sumperk (CZ); Stanislav Hasik, Radejov (CZ)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 114 days.

(21) Appl. No.: 17/149,291

(22) Filed: Jan. 14, 2021

(65) Prior Publication Data
US 2022/0224263 A1 Jul. 14, 2022

(51) Int. Cl.
| | |
|---|---|
| *H01F 38/18* | (2006.01) |
| *H02P 7/29* | (2016.01) |
| *G01R 33/07* | (2006.01) |
| *H02P 6/16* | (2016.01) |
| *H02P 7/28* | (2016.01) |

(52) U.S. Cl.
CPC ............ *H02P 7/29* (2013.01); *G01R 33/07* (2013.01); *H02P 6/16* (2013.01); *H02P 7/2805* (2013.01)

(58) Field of Classification Search
CPC ... H01F 38/18; H02P 7/29; H02P 6/16; H02P 7/2805; G01R 33/07
See application file for complete search history.

(56) References Cited

U.S. PATENT DOCUMENTS

| | | | |
|---|---|---|---|
| 5,754,732 A | 5/1998 | Mahu | |
| 5,798,622 A | 8/1998 | Hirai et al. | |

(Continued)

FOREIGN PATENT DOCUMENTS

| | | |
|---|---|---|
| CN | 106300702 B | 1/2017 |
| CN | 110676945 A | 1/2020 |
| EP | 2869316 A1 | 10/2014 |
| WO | 2018006729 A1 | 11/2018 |

OTHER PUBLICATIONS

Precision Microdrives, Tech Blog, "DC Motor Speed: Voltage and Torque Relationships," downloaded from: https://www.precisionmicrodrives.com/content/dc-motor-speed-voltage-and-torque-relationships/ on Jan. 12, 2021.

(Continued)

*Primary Examiner* — Cortez M Cook
(74) *Attorney, Agent, or Firm* — Lorenz & Kopf, LLP

(57) ABSTRACT

A contactless power supply and motor control system includes a pulse width modulator, a rotary transformer, a demodulator circuit, a motor driver, and a motor. The pulse width modulator supplies a first pulse width modulated (PWM) signal that has a duty cycle and a first amplitude. The rotary transformer receives the PWM signal. The secondary winding is rotatable relative to the primary winding and supplies a second PWM signal having the duty cycle and a second amplitude. The demodulator circuit is rotatable with the secondary winding and supplies a demodulated direct current (DC) voltage having a DC voltage amplitude. The motor driver is rotatable with the secondary winding and the demodulator circuit and controllably supplies motor current. The motor receives the motor current and rotates at a rotational speed.

19 Claims, 3 Drawing Sheets

(56) References Cited

U.S. PATENT DOCUMENTS

| | | | |
|---|---|---|---|
| 7,800,325 | B2 | 9/2010 | Song et al. |
| 8,174,134 | B2 | 5/2012 | Bohori et al. |
| 9,118,206 | B2 * | 8/2015 | Peterson ................... H02J 7/34 |
| 9,525,376 | B2 | 12/2016 | Box |
| 9,748,040 | B2 | 8/2017 | Reisch et al. |
| 2008/0191685 | A1 | 8/2008 | Dhuyvetter et al. |
| 2015/0015156 | A1 | 1/2015 | Angelin et al. |
| 2015/0115762 | A1 * | 4/2015 | Rozman ................... H01F 38/18 |
| | | | 336/123 |

OTHER PUBLICATIONS

Yedamale, Padmaraja, Brushless DC (BLDC) Motor Fundamentals, Microchip AN885, Jul. 28, 2003, downloaded from o http://ww1.microchip.com/downloads/en/AppNotes/00885a.pdf on Jan. 12, 2021.

Bell, Bob, "Introduction to Push-Pull and Cascaded Power Converter Topologies," National Semiconductor, Jul. 10, 2003, downloaded from: o http://electronique.marcel.free.fr/VAE/Docs/OT1%20Controleur/Conv%20DC-DC/National/cascade_tutorial_0710.pdf on Jan. 12, 2021.

Schmidt-Walter, Dr. Heinz, et al. Fullbridge Push-Pull Converter, downloaded from: http://schmidt-walter-schaltnetzteile.de/smps_e/vgw_smps_e.html on Jan. 12, 2021.

Wikipedia, "Rotary Transformer", downloaded from: https://en.wikipedia.org/wiki/Rotary_transformer#:~:text=Rotary %20transformers%20are%20constructed%20by,one%20of%20the%20rotating%20parts.&text=These%20rotary%20transformers%20have%20a,shaped%2C%20air%20gap%20between%20windings, on Jan. 12, 2021.

Transformer and Inductor Design Handbook Chapter 19—Rotary Transformer Design, 2004, downloaded from https://coefs.uncc.edu/mnoras/files/2013/03/Transformer-and-Inductor-Design-Handbook_Chapter_19.pdf on Jan. 12, 2021.

* cited by examiner

CONTACTLESS POWER SUPPLY AND MOTOR CONTROL SYSTEM

STATEMENT REGARDING SPONSORED RESEARCH OR DEVELOPMENT

This invention was made with support from the European Space Agency (ESA), via the Outside Funding Program Name: "Framework Project Implementing ESA's Support of Space-related Activities in the Czech Republic", Contract No. ESA A0/1-9018/17/NL/GLC/hh.

TECHNICAL FIELD

The present disclosure generally relates to power supply to, and control of, a motor, and more particularly relates to a contactless power supply and motor control system.

BACKGROUND

Many systems include an electric motor that is movable, via an actuator or other assembly, relative to its power source. For example, in a control moment gyro (CMG) one or more electric flywheel motors are movable, via one or more gimbal assemblies, relative to the flywheel motor power sources. As such, an electrical connection that allows this relative motion is needed in order to operate the electric motor.

One approach for providing an electrical connection is a direct-wired approach. With this approach, variously configured leads, such as cable wraps, twisted cables, etc., may be used. Alternatively, sliprings with sliding metal contacts may be used. These approaches, however, exhibit certain drawbacks. The drawbacks include range-of-motion limits, reduction in component lifetime, reduced reliability, and increased cost, just to name a few.

Another approach is a contactless one. However, presently known contactless approaches also exhibit certain drawbacks. For example, known contactless approaches rely on alternating current (AC) transmission to the motor. Unfortunately, during start and low-speed motor operation, the frequency of the transmitted AC is significantly reduced, and approaches direct current (DC), which cannot be transmitted across the contactless interfaces.

Hence, there is a need for contactless power supply and motor control system that reliably provides power to, and allows control of, a motor even during start and low-speed motor operations. The system disclosed herein addresses at least this need.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a contactless power supply and motor control system includes a pulse width modulator, a rotary transformer, a demodulator circuit, a motor driver, and a motor. The pulse width modulator is configured to supply a first pulse width modulated (PWM) signal that has a duty cycle and a first amplitude. The rotary transformer has a primary winding and a secondary winding. The primary winding is coupled to receive the PWM signal from the pulse width modulator, and the secondary winding is rotatable relative to the primary winding and is configured to supply a second PWM signal having the duty cycle and a second amplitude. The demodulator circuit is rotatable with the secondary winding. The demodulator circuit is coupled to receive the second PWM signal from the secondary winding and is configured, upon receipt thereof, to supply a demodulated direct current (DC) voltage having a DC voltage amplitude. The motor driver is rotatable with the secondary winding and the demodulator circuit. The motor driver is coupled to receive the demodulated DC voltage from the demodulator circuit and is configured, upon receipt thereof, to controllably supply motor current. The motor is coupled to receive the motor current from the motor driver and is configured, upon receipt thereof, to rotate at a rotational speed.

In another embodiment, a system includes an actuator and a motor control system. The actuator includes at least one component that is rotatable about a first rotational axis. The motor control system includes a pulse width modulator, a rotary transformer, a demodulator circuit, a motor driver, and a motor. The pulse width modulator is configured to supply a first pulse width modulated (PWM) signal that has a duty cycle and a first amplitude. The rotary transformer has a primary winding and a secondary winding. The primary winding is coupled to receive the PWM signal from the pulse width modulator. The secondary winding is coupled to the at least one component and is rotatable therewith, relative to the primary winding, about the first rotational axis. The secondary winding is configured to supply a second PWM signal having the duty cycle and a second amplitude. The demodulator circuit is rotatable with the secondary winding about the first rotational axis. The demodulator circuit is coupled to receive the second PWM signal from the secondary winding and is configured, upon receipt thereof, to supply a demodulated direct current (DC) voltage having a DC voltage amplitude. The motor driver is rotatable with the secondary winding and the demodulator circuit about the first rotational axis. The motor driver is coupled to receive the demodulated DC voltage from the demodulator circuit and is configured, upon receipt thereof, to controllably supply motor current. The motor includes a stator and a rotor, and is rotatable with the secondary winding, the demodulator circuit, and the motor driver about the first rotational axis. The stator is coupled to receive the motor current from the motor driver and is configured, in response thereto, to generate a torque on the rotor that causes the rotor to rotate at a rotational speed about a second rotational axis.

In yet another embodiment, a control moment gyro (CMG) includes a CMG housing, a gimbal motor, and a flywheel motor control system. The gimbal motor is coupled to the CMG housing and includes a gimbal motor component that is rotatable about a gimbal axis. The flywheel motor control system includes a pulse width modulator, a rotary transformer, a demodulator circuit, a motor driver, and a motor. The pulse width modulator is configured to supply a first pulse width modulated (PWM) signal that has a duty cycle and a first amplitude. The rotary transformer has a primary winding and a secondary winding. The primary winding is coupled to receive the PWM signal from the pulse width modulator. The secondary winding is coupled to the gimbal motor component and is rotatable therewith, relative to the primary winding, about the gimbal axis. The secondary winding is configured to supply a second PWM signal having the duty cycle and a second amplitude. The demodulator circuit is rotatable with the secondary winding about the gimbal axis. The demodulator circuit is coupled to receive the second PWM signal from the secondary winding and is configured, upon receipt thereof, to supply a demodulated direct current (DC) voltage having a DC voltage amplitude. The motor driver is rotatable with the secondary winding and the demodulator circuit about the gimbal axis. The motor driver is coupled to receive the demodulated DC voltage from the demodulator circuit and is configured, upon receipt thereof, to controllably supply motor current. The motor includes a stator and a rotor, and is rotatable with the secondary winding, the demodulator circuit, and the motor driver about the gimbal axis. The stator is coupled to receive the motor current from the motor driver and is configured, in response thereto, to generate a torque on the rotor that causes the rotor to rotate at a rotational speed about a flywheel axis.

Furthermore, other desirable features and characteristics of the contactless power supply and motor control system will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
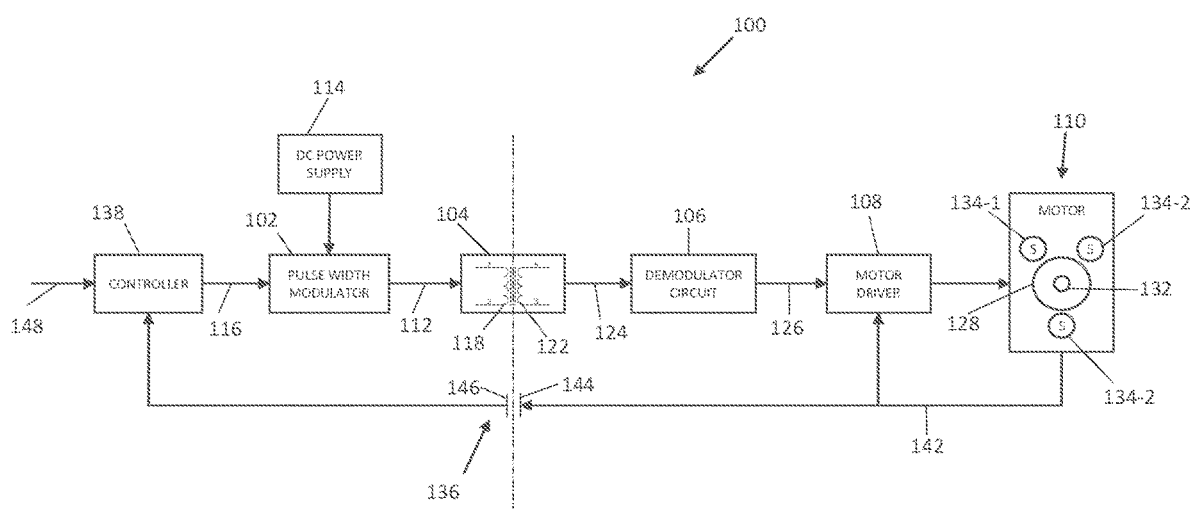
FIG. 1 depicts a functional block diagram of one embodiment of a contactless power supply and motor control system.

Referring now to FIG. 1, a functional block diagram of one embodiment of a contactless power supply and motor control system is depicted. The depicted system 100 includes at least a pulse width modulator 102, a rotary transformer 104, a demodulator circuit 106, a motor driver 108, and a motor 110. The pulse width modulator 102 is configured to supply a first pulse width modulated (PWM) signal 112 having a duty cycle and a first amplitude. More specifically, the pulse width modulator 102 is coupled to receive electric power from a DC power supply 114 and is further coupled to receive a duty cycle command signal 116. The pulse width modulator 102 is configured, in response to the duty cycle command, to determine the first duty cycle (e.g., the commanded duty cycle) and supply the first PWM signal 112. It will be appreciated that the pulse width modulator 102 may be implemented using any one of numerous pulse width modulator circuits now known or developed in the future. It will additionally be appreciated that the frequency and duty cycle of the first PWM signal 112 may vary. In one particular embodiment, however, the frequency is in the range of 50 kHz to 100 kHz, and the duty cycle is in the range of 0% to 50%.

The rotary transformer 104 includes a primary winding 118 and a secondary winding 122. The primary winding 118 is coupled to receive the PWM signal 112 from the pulse width modulator 102. The secondary winding 122, as is generally known, is rotatable relative to the primary winding 118, about a rotational axis 119, and supplies a second PWM signal 124. The second PWM signal 124 has the same frequency and duty cycle as the first PWM signal 112, but it has a second amplitude that is proportional to the primary-to-secondary winding ratio (N1/N2) of the rotary transformer 104. It will be appreciated that the rotary transformer 104 may be implemented using any one of numerous rotary transformers now known or developed in the future. It will additionally be appreciated that the primary-to-secondary winding ratio (N1/N2) may vary from embodiment-to-embodiment and be selected based on system functional requirements.

The demodulator circuit 106 is rotatable with the secondary winding 122 of the rotary transformer 104 and is coupled to receive the second PWM signal 124 therefrom. The demodulator circuit 106 is configured, upon receipt of the second PWM signal 124, to supply a demodulated direct current (DC) voltage 126 having a DC voltage amplitude ($V_{demod}$). It will be appreciated that the demodulator circuit 106 may be implemented using any one of numerous demodulator configurations now known or developed in the future. Preferably, however, the demodulator circuit 106 is configured such that the DC voltage amplitude of the demodulated DC voltage is as shown in Equation 1:

$$V_{demod} = V_{supply} * 2 * dc * (N1/N2), \quad \text{(Eq. 1)}$$

where:
$V_{supply}$ is the amplitude of the first PWM signal,
dc is the duty cycle of the first and second PWM signals, and
N1/N2 is the winding ratio of the rotary transformer.

The motor driver 108 is rotatable with the secondary winding 122 and the demodulator circuit 106. The motor driver 108 is coupled to receive the demodulated DC voltage 126 from the demodulator circuit 106 and is configured, upon receipt of the demodulated DC voltage 126, to controllably supply motor current to the motor 110. It will be appreciated that the motor driver 108 may be implemented using any one of numerous motor drivers now known or developed in the future.

The motor 110 is rotatable with the secondary winding 122, the demodulator circuit 106, and the motor driver 108. The motor 110 is coupled to receive the motor current from the motor driver 108 and is configured, upon receipt of the motor current, to rotate at a rotational speed. More specifically, the motor 110, like most conventional motors, includes a stator 128 and a rotor 132. The stator 128 receives the motor current from the motor driver 108 and generates a torque on the rotor 132 that causes the rotor 132 to rotate at the rotational speed. Although the motor 110 may be variously configured and implemented, in the depicted embodiment, it is implemented as a three-phase brushless DC (BLDC) motor. Thus, the motor driver 108 preferably supplies three phases of motor current to the motor 110.

In addition to each of the above system components, the contactless power supply and motor control system 100 may, at least in the depicted embodiment, include one or more sensors 134, a rotary element 136, and a controller 138. The one or more sensors 134 are coupled to, and are configured to sense the rotational speed of, the motor 110. The one or more sensors 134 in turn supply a speed feedback signal 142 representative of the sensed motor speed. Although the number and type of sensors 134 may vary, in the depicted embodiment, the system includes three Hall sensors 134 (134-1, 134-2, 134-3), which are disposed on the stator 128 and are each configured to sense the magnetic pole position of the rotor 132 and supply a speed feedback signal 142.

Regardless of the type and number of sensors 134 that are used, the speed feedback signals 142 are supplied to the rotary element 136 and to the motor driver 108. The rotary element 136, which may be implemented as a rotary capacitive element or a rotary inductive element, includes rotatable portion 144 and a non-rotatable portion 146. The rotatable portion 144 is coupled to receive the one or more speed feedback signals 142 from the one or more sensors 134 and is rotatable, with the secondary winding 122, the demodulator circuit 106, the motor driver 108, and the motor 110, relative to the non-rotatable portion 146. The rotatable portion 144 in turn supplies the one or more speed feedback signals 142, either capacitively or inductively, to the non-rotatable portion 146. The non-rotatable portion 146 then supplies the one or more speed feedback signals 142 to the controller 138.

The controller 138 is coupled to receive a motor speed setpoint signal 148 and the one or more speed feedback signals 142. The controller 138 is configured, upon receipt of the motor speed setpoint signal 148 and the one or more speed feedback signals 142, to supply the duty cycle command signal 116 to the pulse width modulator 102.

It was previously noted that the motor driver 108 is responsive to the demodulated DC voltage 126 to controllably supply the motor current to the motor 110. More specifically, the motor driver 108 controls the rotational speed of the rotor 132 ($\omega_{rotor}$), in revolutions per minute (rpm), in accordance with Equation 2:

$$\omega_{rotor} = K_v * V_{supply}, \quad (Eq. 2)$$

where:
$K_v$ is a motor velocity constant, and
$V_{supply}$ is the amplitude of the first PWM signal.

Now, by combining Equation 1 and Equation 2 together, it is seen from Equation 3 below that the speed of the motor 110 is may be controlled by controlling only the duty cycle of the first PWM signal 112:

$$\omega_{rotor} = V_{supply} * 2 * dc * (N1/N2) * K_v. \quad (Eq. 3)$$

Figure 2:
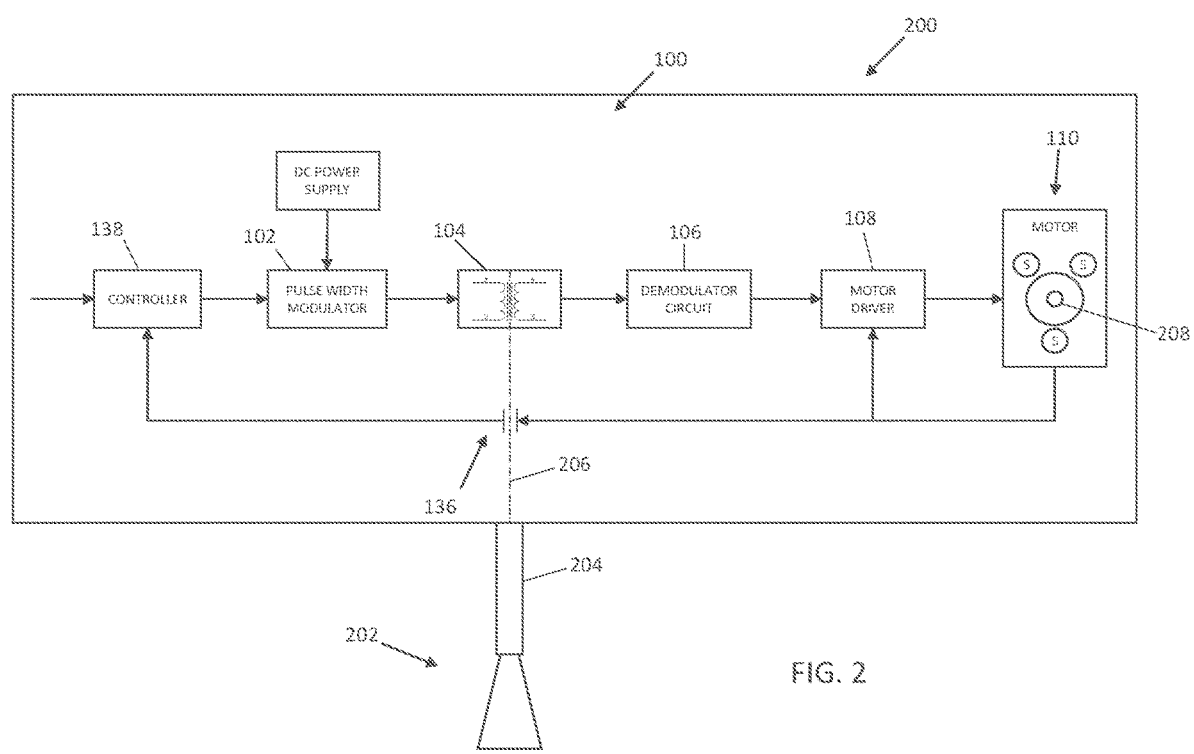
FIG. 2 depicts a functional block diagram of one embodiment of an end-use system in which the contactless power supply and motor control system may be implemented.

The contactless power supply and motor control system 100 described herein may be used in various end-use systems in which the motor 110 needs to be movable relative to its power and control sources. One example end-use system is depicted in FIG. 2. The system 200 depicted therein includes an actuator 202 and the contactless power supply and motor control system 100. The actuator 202 includes at least one component 204 that is rotatable about a first rotational axis 206. As FIG. 2 depicts, the secondary winding 122 is coupled to the at least one component 204 and is rotatable therewith about the first rotational axis 206. Thus, as may be appreciated, the demodulator circuit 106, the motor driver 108, the motor 110, and the rotatable portion 144 are also rotatable with the at least one component about the first rotational axis 206. The rotor 132, however, is independently rotatable about a second, independent rotational axis 208.

Figure 3:
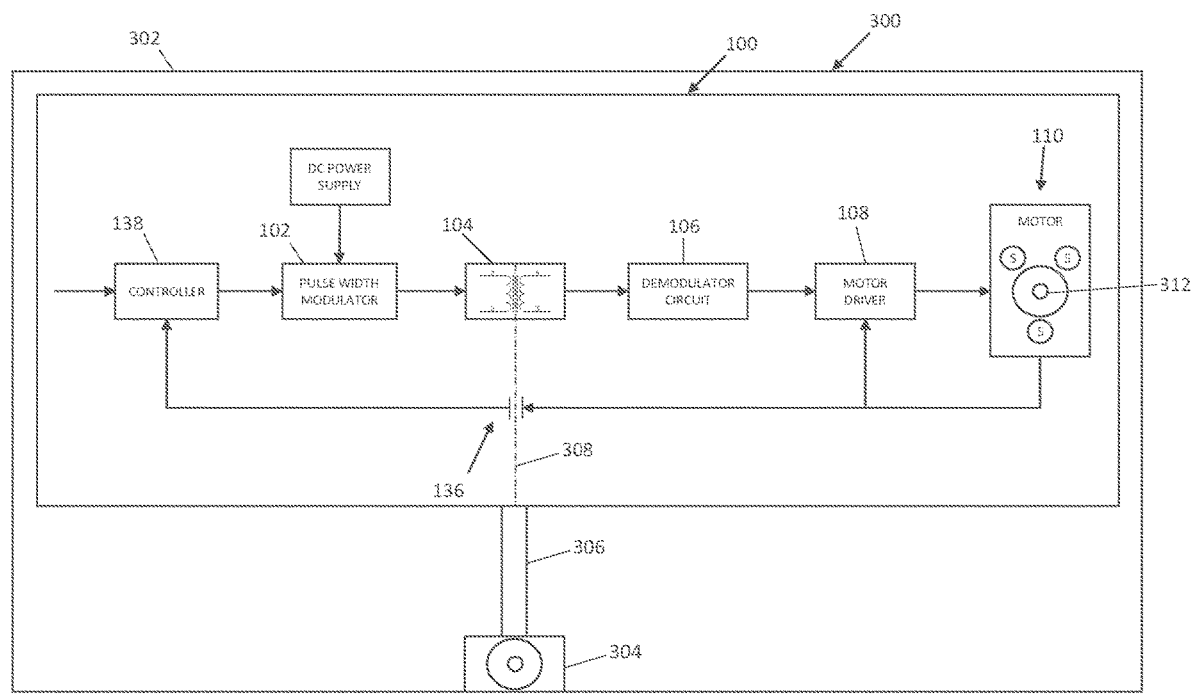
FIG. 3 depicts a functional block diagram of another embodiment of an end-use system in which the contactless power supply and motor control system may be implemented.

Another example end-use system is depicted in FIG. 3. The system depicted therein is a control moment gyro (CMG) 300, which includes a CMG housing 302, a gimbal motor 304, and the contactless power supply and motor control system 100. The gimbal motor 304 is coupled to the CMG housing 302 and includes a gimbal motor component 306 that is rotatable about a gimbal axis 308. In the CMG 300 environment, the contactless power supply and motor control system 100 is implemented as a flywheel motor control system. As FIG. 3 depicts, the secondary winding 122 is coupled to the gimbal motor component 306 and is rotatable therewith about the gimbal axis 308. Thus, as may be appreciated, the demodulator circuit 106, the motor driver 108, the motor 110, and the rotatable portion 144 are also rotatable with the gimbal motor component 306 about the gimbal axis 308. The rotor 132, however, is independently rotatable about a second, independent rotational axis 312 (e.g., a flywheel axis).

The contactless power supply and motor control system 100 disclosed herein reliably provides power to, and allows control of, a motor, in a contactless way, even during start and low-speed motor operations.

Those of skill in the art will appreciate that the various illustrative logical blocks, modules, circuits, and algorithm steps described in connection with the embodiments disclosed herein may be implemented as electronic hardware, computer software, or combinations of both. Some of the embodiments and implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. For example, an embodiment of a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments described herein are merely exemplary implementations.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, or organic properties corresponding to the data bits. It should be appreciated that the various block components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

Some of the functional units described in this specification have been referred to as "modules" in order to more particularly emphasize their implementation independence. For example, functionality referred to herein as a module may be implemented wholly, or partially, as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like. Modules may also be implemented in software for execution by various types of processors. An identified module of executable code may, for instance, comprise one or more physical or logical modules of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module. Indeed, a module of executable code may be a single instruction, or many instructions, and may even be distributed over several different code segments, among different programs, and across several memory devices. Similarly, operational data may be embodied in any suitable form and organized within any suitable type of data structure. The operational data may be collected as a single data set, or may be distributed over different locations including over different storage devices, and may exist, at least partially, merely as electronic signals on a system or network.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A contactless power supply and motor control system, comprising:
  a pulse width modulator configured to supply a first pulse width modulated (PWM) signal, the first PWM signal having a duty cycle and a first amplitude;

a rotary transformer having a primary winding and a secondary winding, the primary winding coupled to receive the PWM signal from the pulse width modulator, the secondary winding rotatable relative to the primary winding and configured to supply a second PWM signal having the duty cycle and a second amplitude;

a demodulator circuit rotatable with the secondary winding, the demodulator circuit coupled to receive the second PWM signal from the secondary winding and configured, upon receipt thereof, to supply a demodulated direct current (DC) voltage having a DC voltage amplitude;

a motor driver rotatable with the secondary winding and the demodulator circuit, the motor driver coupled to receive the demodulated DC voltage from the demodulator circuit and configured, upon receipt thereof, to controllably supply motor current;

a sensor coupled to the motor, the sensor configured to sense a rotational speed of the motor and supply a speed feedback signal representative thereof;

a rotary element having a rotatable portion and a non-rotatable portion, the rotatable portion coupled to receive the speed feedback signal from the sensor and rotatable, with the secondary winding, relative to the non-rotatable portion; and a motor coupled to receive the motor current from the motor driver and configured, upon receipt thereof, to rotate at the rotational speed.

2. The system of claim 1, further comprising:
a controller configured to receive a motor speed setpoint signal, the controller additionally coupled to receive the speed feedback signal from the non-rotatable portion, the controller configured, upon receipt of the motor speed setpoint signal and the speed feedback signal, to supply a duty cycle command signal to the pulse width modulator,
wherein the pulse width modulator is configured, in response to the duty cycle command signal, to determine the duty cycle.

3. The system of claim 1, wherein the rotary element comprises a rotary capacitive element.

4. The system of claim 1, wherein the rotary element comprises a rotary inductive element.

5. The system of claim 1, wherein the sensor comprises one or more Hall sensors.

6. The system of claim 1, wherein:
the motor comprises a stator and a rotor and is rotatable with the secondary winding, the demodulator circuit, and the motor driver;
the stator is coupled to receive the motor current from the motor driver; and
the rotor rotates at the rotational speed.

7. The system of claim 6, wherein the DC voltage amplitude of the demodulated DC voltage ($V_{demod}$) supplied by the demodulator circuit is:

$$V_{demod} = V_{supply} * 2 * dc * (N1/N2),$$

wherein:
$V_{supply}$ is the first amplitude of the first PWM signal supplied by the pulse width modulator,
dc is the duty cycle of the first and second PWM signals, and
N1/N2 is a winding ratio of the rotary transformer.

8. The system of claim 7, wherein the rotational speed of the rotor ($\omega_{rotor}$), in revolutions per minute (rpm), is:

$$\omega_{rotor} = V_{supply} * 2 * dc * (N1/N2) * K_v$$

wherein $K_v$ is a motor velocity constant in units.

9. The system of claim 1, wherein:
a frequency of each of the first and second PWM signals is in a range of 50 kHz to 100 kHz; and
the duty cycle of each of the first and second PWM signals is in a range of 0% to 50%.

10. A system, comprising:
an actuator including at least one component that is rotatable about a first rotational axis; and
a motor control system, the motor control system comprising:
a pulse width modulator configured to supply a first pulse width modulated (PWM) signal, the first PWM signal having a duty cycle and a first amplitude;
a rotary transformer having a primary winding and a secondary winding, the primary winding coupled to receive the PWM signal from the pulse width modulator, the secondary winding coupled to the at least one component and rotatable therewith, relative to the primary winding, about the first rotational axis, the secondary winding configured to supply a second PWM signal having the duty cycle and a second amplitude;
a demodulator circuit rotatable with the secondary winding about the first rotational axis, the demodulator circuit coupled to receive the second PWM signal from the secondary winding and configured, upon receipt thereof, to supply a demodulated direct current (DC) voltage having a DC voltage amplitude;
a motor driver rotatable with the secondary winding and the demodulator circuit about the first rotational axis, the motor driver coupled to receive the demodulated DC voltage from the demodulator circuit and configured, upon receipt thereof, to controllably supply motor current; and
a motor comprising a stator and a rotor, the motor rotatable with the secondary winding, the demodulator circuit, and the motor driver about the first rotational axis, the stator coupled to receive the motor current from the motor driver and configured, in response thereto, to generate a torque on the rotor that causes the rotor to rotate at a rotational speed about a second rotational axis.

11. The system of claim 10, further comprising:
a sensor coupled to the motor, the sensor configured to sense the rotational speed of the motor and supply a speed feedback signal representative thereof; and
a rotary element having a rotatable portion and a non-rotatable portion, the rotatable portion coupled to receive the speed signal from the sensor and rotatable, with the secondary winding, relative to the non-rotatable portion.

12. The system of claim 11, further comprising:
a controller configured to receive a motor speed setpoint signal, the controller additionally coupled to receive the speed feedback signal from the non-rotatable portion, the controller configured, upon receipt of the motor speed setpoint signal and the speed feedback signal, to supply a duty cycle command signal to the pulse width modulator,
wherein the pulse width modulator is configured, in response to the duty cycle command signal, to determine the duty cycle.

13. The system of claim 11, wherein the rotary element comprises a rotary capacitive element.

14. The system of claim 11, wherein the rotary element comprises a rotary inductive element.

15. The system of claim 11, wherein the sensor comprises one or more Hall sensors.

16. The system of claim 10, wherein the DC voltage amplitude of the demodulated DC voltage ($V_{demod}$) supplied by the demodulator circuit is:

$$V_{demod} = V_{supply} * 2 * dc * (N1/N2),$$

wherein:
$V_{supply}$ is the first amplitude of the first PWM signal supplied by the pulse width modulator,
dc is the duty cycle of the first and second PWM signals, and
N1/N2 is a winding ratio of the rotary transformer.

17. The system of claim 16, wherein the rotational speed of the rotor ($\omega_{rotor}$), in revolutions per minute (rpm), is:

$$\omega_{rotor} = V_{supply} * 2 * dc * (N1/N2) * K_v,$$

wherein $K_v$ is a motor velocity constant in units.

18. The system of claim 1, wherein:
a frequency of first and second PWM signals is each in a range of 50 kHz to 100 kHz; and
the duty cycle of the first and second PWM signals is each in a range of 0% to 50%.

19. A control moment gyro (CMG), comprising:
a CMG housing;
a gimbal motor coupled to the CMG housing and including a gimbal motor component that is rotatable about a gimbal axis; and
a flywheel motor control system, comprising:
a pulse width modulator configured to supply a first pulse width modulated (PWM) signal, the first PWM signal having a duty cycle and a first amplitude;
a rotary transformer having a primary winding and a secondary winding, the primary winding coupled to receive the PWM signal from the pulse width modulator, the secondary winding coupled to the gimbal motor component and rotatable therewith, relative to the primary winding, about the gimbal axis, the secondary winding configured to supply a second PWM signal having the duty cycle and a second amplitude;
a demodulator circuit rotatable with the secondary winding about the gimbal axis, the demodulator circuit coupled to receive the second PWM signal from the secondary winding and configured, upon receipt thereof, to supply a demodulated direct current (DC) voltage having a DC voltage amplitude;
a motor driver rotatable with the secondary winding and the demodulator circuit about the gimbal axis, the motor driver coupled to receive the demodulated DC voltage from the demodulator circuit and configured, upon receipt thereof, to controllably supply motor current; and
a motor comprising a stator and a rotor, the motor rotatable with the secondary winding, the demodulator circuit, and the motor driver about the gimbal axis, the stator coupled to receive the motor current from the motor driver and configured, in response thereto, to generate a torque on the rotor that causes the rotor to rotate at a rotational speed about a flywheel axis.

* * * * *